United States Patent [19]
Egloff

[11] Patent Number: 5,909,627
[45] Date of Patent: Jun. 1, 1999

[54] PROCESS FOR PRODUCTION OF THIN LAYERS OF SEMICONDUCTOR MATERIAL

[75] Inventor: Richard Egloff, Yorktown Heights, N.Y.

[73] Assignee: Philips Electronics North America Corporation, New York, N.Y.

[21] Appl. No.: 09/080,783

[22] Filed: May 18, 1998

[51] Int. Cl.$^6$ .......... H01L 21/76; H01L 21/265; H01L 21/425

[52] U.S. Cl. .......... 438/406; 438/522; 438/526; 438/530

[58] Field of Search .......... 468/514, 517, 468/522, 526, 530; 438/406, 149

[56] References Cited

U.S. PATENT DOCUMENTS

| | | | |
|---|---|---|---|
| 4,684,964 | 8/1987 | Pankove et al. | 357/17 |
| 5,198,371 | 3/1993 | Li | 437/11 |
| 5,318,652 | 6/1994 | Hocker et al. | 156/273.9 |
| 5,374,564 | 12/1994 | Bruel | 437/24 |
| 5,523,587 | 6/1996 | Kwo | 257/64 |

*Primary Examiner*—John F. Niebling
*Assistant Examiner*—Christopher Lattin
*Attorney, Agent, or Firm*—John C. Fox

[57] ABSTRACT

Thin layers of semiconductor material having a high degree of surface uniformity are produced by: implantion of deuterium ions into a body of semiconductor material to form a buried region of high stress, the buried region defining a thin outer region of the body; attaching a stiffening carrier to the thin outer region of the semiconductor body; and heating the body at 350–450 degrees C. to separate the thin outer region. The separated layer is useful in the production of silicon-on-insulator semiconductor devices, and silicon-on-glass devices for liquid crystal display and microwave applications.

8 Claims, 2 Drawing Sheets

PROCESS FOR PRODUCTION OF THIN LAYERS OF SEMICONDUCTOR MATERIAL

BACKGROUND OF THE INVENTION

This invention relates to the production of thin films of semiconductor material having a high degree of surface uniformity, and more particularly relates to a process involving ion implantation into a body of semiconductor material to form a thin surface region defined by a buried region of high stress, followed by heating to separate the thin region from the body of the semiconductor material.

In U.S. Pat. No. 5,374,564, incorporated herein by reference, a process is described for the production of thin films of semiconductor material having a high degree of surface uniformity. The process has three stages: first, implantion of ions of hydrogen or a rare gas to form a buried region of high stress in a body of semiconductor material to define a thin surface region; second, attaching a stiffener to the surface of the thin region; and third, heating the semiconductor body to separate the thin region from the body. The patent teaches that the implantation must take place at a temperature below 500 degrees C., eg., between 20 and 450 degrees C., while heating to achieve separation must take place above 500 degrees C.

A potential use for such an "exfoliation" process is in the formation of silicon-on-insulator (SOI) substrates for high voltage semiconductor devices. Other potential uses, such as the removal of a thin layer of semiconductor material from a localized region of a partially completed semiconductor device or attachment to a glass carrier, are generally not feasible due to the heat treatment temperature required for separation.

OBJECTS AND SUMMARY OF THE INVENTION

It is an object of the invention to provide an exfoliation process of the type described above in which the heat treatment temperatures required for separation are significantly reduced.

In accordance with the invention, it has been discovered that the heat treatment temperatures of the exfoliation process can be significantly reduced by substituting deuterium for hydrogen and the rare gases as the implant species.

The lower heat treatment temperatures enable use of the process to remove thin layers from localized regions of partially completely semiconductor devices, without disturbing surrounding dopant profiles and non-refractory metallizations. Such localized regions can be selectively removed by selectively implanting deuterium into the localizsed regions, for example, in accordance with a predetermined pattern, and then heating the device to achieve localized exfoliation.

In addition, the lower heat treatment temperatures enable the use of high temperature glass as the stiffening carrier during heat treatment, whereafter the thin semiconductor layer can be further processed in situ on the glass. Such a semiconductor-on-glass product would be useful in the production of microwave devices on glass, and particularly advantageous in the production of high-quality integrated driver electronics for active matrix liquid crystal displays employing polysilicon-on-glass technology for the matrix electronics.

In accordance with the invention, a thin layer of semiconductor material having a high degree of surface uniformity is produced by a three-stage process in which:

first, deuterium ions are implanted into a body of semiconductor material to form a buried region of high stress in the body, the buried region defining a thin surface region of semiconductor material;

second, a stiffening carrier is attached to the surface of the thin surface region of the body; and third, the body is heated to a temperature within the range of 350 to 450 degrees C. to separate the thin region from the body.

According to a preferred embodiment of the invention, a layer of an insulating material such as an oxide is formed on the surface of the semiconductor body prior to ion implantation, eg., a thermally or chemically formed layer, of a thickness to allow the implanted ions to penetrate to the desired depth in the semiconductor body. The purpose of such a layer is to protect the silicon surface from contamination and erosion during implantation. After implantation, this so-called "screen ox" layer is removed to expose the smooth clean silicon surface for bonding to the stiffening carrier.

The carrier is preferably attached to the semiconductor body by surface bonding due to Van der Waal's forces. To promote such bonding, the surfaces of the body and the carrier are cleaned to remove contaminants prior to contact. Cleaning agents which promote the formation of hydrophilic surfaces, such as a sulfuric acid/hydrogen peroxide mixture, which forms a very thin (typically about 20 Angstroms) chemical oxide layer, are especially preferred.

Choosing a carrier material which is a suitable substrate for an SOI device, such as a single crystal or polycrystalline semiconductor material, a high temperature glass or quartz, enables further processing of the exfoliated SOI layer in situ, without the need for detachment from the carrier. If a single crystal or polycrystalline semiconductor material is chosen for the carrier, an oxide layer destined to become the buried oxide layer of the SOI device can be formed on the carrier prior to attachment to the silicon body. As is known, the thickness of such a buried oxide layer is typically in the range of about 1 micron.

BRIEF DESCRIPTION OF THE DRAWINGS

The invention will now be described in terms of a limited number of preferred embodiments, with reference to the drawings, in which.

DESCRIPTION OF THE PREFERRED EMBODIMENTS

Figure 1:
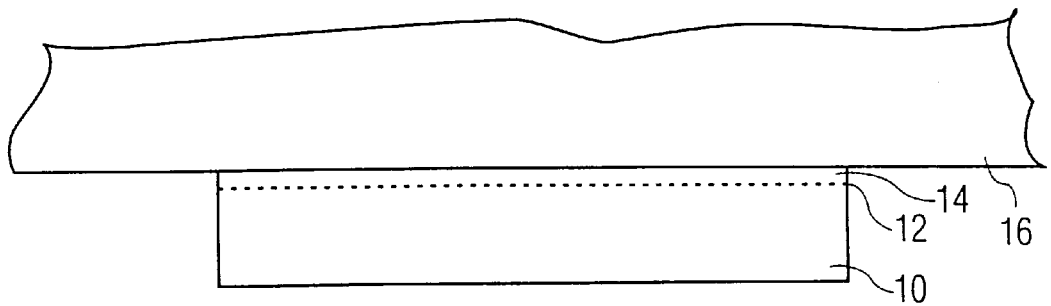
FIG. 1 is a side elevation view of a semiconductor body having a buried region of implanted D+ ions extending across the entire width of the body, and a stiffening carrier attached to the surface of the body adjacent the buried region.

Referring to FIG. 1, there is shown a schematic representation of a single crystal semiconductor body 10, having a buried region 12 of high stress formed by the implantation of deuterium ions (D+) in accordance with the invention. The buried region 12 defines a thin outer region 14 of the semiconductor body. A stiffening carrier 16, is attached to the surface of the body 10, for example by Van der Waal's forces. Upon heating of the body to a temperature in the range of 350–450 degrees C., the outer region 14 separates or exfoliates from the body 10 along the region of high stress 12. The exfoliated surface has a high degree of thickness uniformity, for example, a variation in thickness of less than 100 Angstroms. The carrier 16 may then be chosen for its properties as a substrate for a silicon-on-insulator device, and processing to form the SOI device may be carried out in-situ after exfoliation. Suitable substrates include quartz and high temperature glass.

Figure 2:
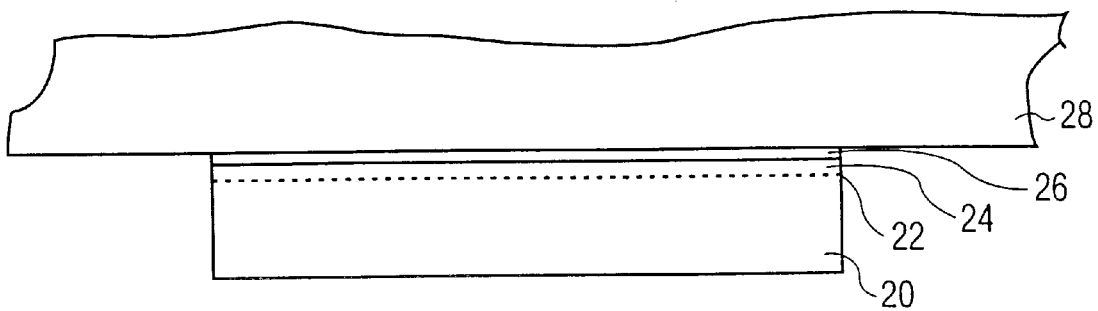
FIG. 2 is a view similar to that of FIG. 1, in which an insulating layer has been formed on the surface of the body adjacent the buried region, and the carrier is attached to the surface of the insulating layer.

FIG. 2 is a schematic representation similar to that of FIG. 1, showing a semiconductor body 20, having a buried region 22, defining a thin outer region 24. The carrier 28 is of a semiconductor material, such as single crystal silicon. Prior to attachment of the carrier 28 to the body 20, an insulating layer 26 is present on the surface of the carrier 28. This insulating layer is formed prior to attachment, of a character and to a thickness to serve as the buried oxide layer of an SOI device. Where the carrier 28 is silicon, the insulating layer may be silicon oxide, formed for example thermally or by chemical vapor deposition.

Prior to implantation, a protective oxide layer known as a "screen ox" layer is preferably formed on the surface of the semiconductor body to be implanted, in order to protect the surface of the semiconductor body from contamination and erosion during implantation. If no screen ox were present, the silicon surface could be damaged, in which case chemical and/or mechanical polishing steps could be required to restore the surface to a smooth and clean condition sufficient for bonding.

Subsequent to implantation, the screen ox layer is removed prior to attachment to the carrier. Also, prior to attachment, the surface of the semiconductor body may be treated to render it hydrophyllic, to promote bonding to the carrier, for example, by treatment with a chemical oxidizing agent to form a very thin oxide layer on the surface.

After attachment to the carrier, the assembly is heated to promote separation of the implanted region from the semiconductor body (exfoliation). The normal heating rate of a laboratory diffusion furnace is sufficient for this purpose; there is no need for a rapid thermal anneal (RTA). Exfoliation results in an extremely uniform surface.

EXAMPLE 1

A prime 2 inch single crystal silicon wafer was given a standard surface cleaning using a mixture of sulfuric acid and hydrogen peroxide at 110 C for 20 minutes, followed by a deionized water rinse, followed by a second cleaning with a 10:1 mixture of deionized water and hydrofluoric acid, followed by a final rinse with deionized water. After cleaning, a 500–2000 Angstrom thick thermal oxide layer (so-called "screen ox") was grown on the wafer surface to prevent contamination and erosion of the silicon surface during implantation. Next, deuterium D+ ions were implanted into the silicon wafer to a dosage of 5E16 ions per cubic centimeter, using an implantation energy of 100 KeV. Following implantation, the implanted surface was again treated with a 10:1 mixture of deionized water and hydroflouric acid for a time sufficient to remove the screen ox layer, typically several minutes, and then the exposed silicon surface was rinsed with deionized water, and treated with a sulfuric acid/hydrogen peroxide mixture for 20 minutes at 110 C in order to form a thin (about 20 Angstrom) chemical oxide layer to promote bonding to the stiffener. After a final deionized water rinse and drying, the treated surface of the wafer was placed in contact with a clean surface of a sheet of Corning type 1737 glass as a stiffener. The resulting silicon-glass composite was placed in a conventional laboratory diffusion furnace having a nitrogen atmosphere, and the temperature was set at 400 degrees C. After an hour, the sample was removed from the furnace. Examination of the sample showed exfoliation of the silicon wafer at an average depth of about 4000 Angstroms, corresponding to the calculated peak depth of ion implantation through the screen ox and silicon. The exfoliated silicon layer exhibited a thickness variation no greater than about 50 Angstroms.

EXAMPLE 2

In order to demonstrate that the region of ion implantation is a region of high stress, which is relieved by thermal treatment, a silicon wafer prepared as described above was implanted with D+ ions stepwise at 100 KeV until a predetermined concentration was reached, while the stress in the implanted region (as determined by wafer warpage) was measured after each implantation step. Results are shown in the table below.

TABLE

| implantation dose (e16) | warpage (microns) |
|---|---|
| zero | 0.86 |
| 2.0 | 3.22 |
| 3.0 | 6.61 |
| 4.0 | 7.46 |
| 5.0 | 6.94* |

*saturation of D+ occurred between 4.0 and 5.0 e 16.

Figure 3:
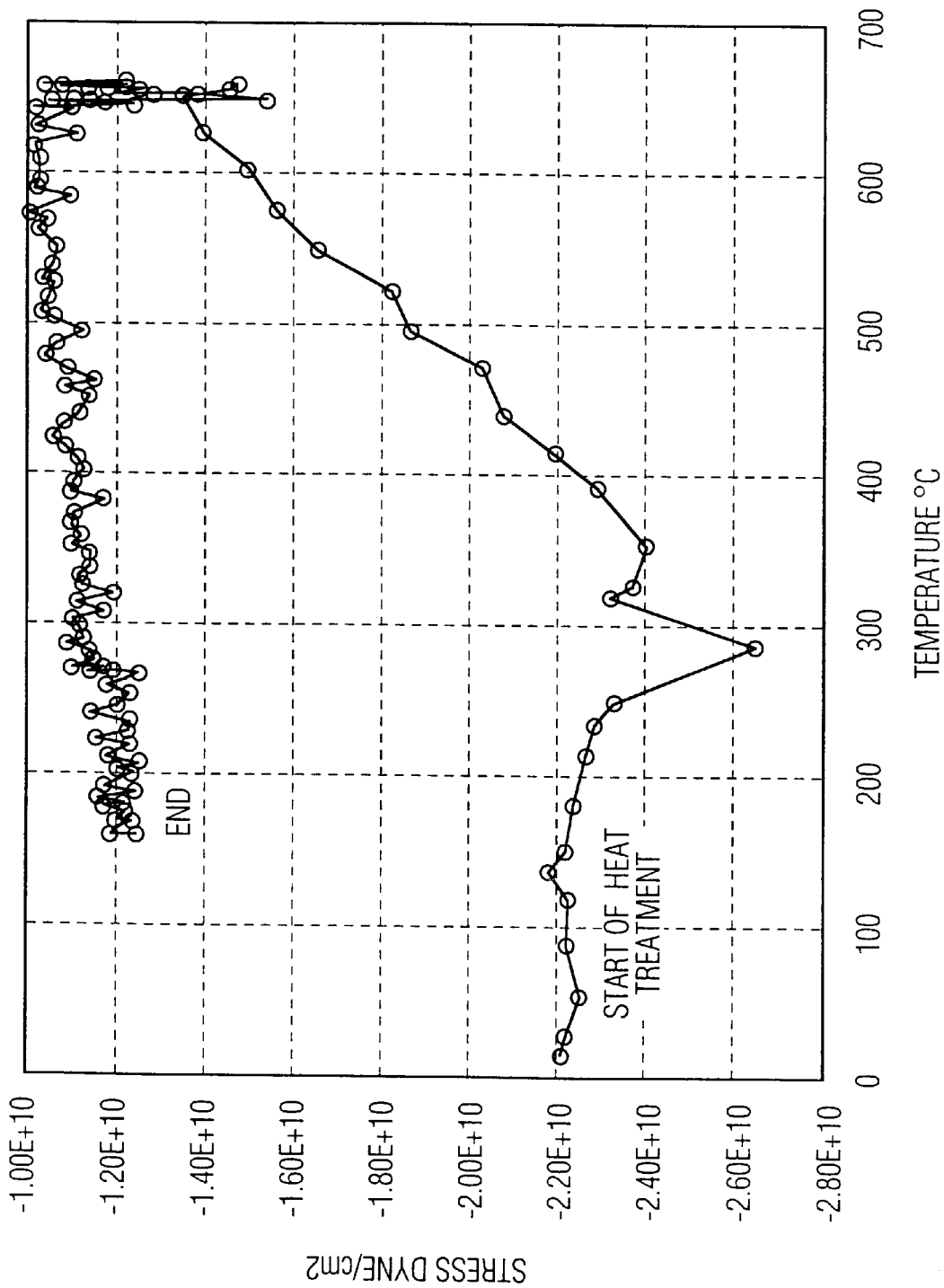
FIG. 3 is a graph of stress in the buried region of a semiconductor body of the type shown in FIG. 2, versus temperature of the body.

The wafer was then heated in a stress measuring tool and the stress level monitored in situ while the temperature was increased. Results are shown graphically in FIG. 3, in which stress in dynes/cm2 is plotted versus temperature in C.

The invention has been described in terms of a limited number of preferred embodiments. However, other embodiments and variations will become apparent to the skilled artisan from the above description and the appended claims, and these embodiments and variations are intended to be encompassed within the scope of the claims as if fully described herein.

What I claim as my invention is:

1. A method of forming a thin layer of semiconductor material, the method comprising:

(a) implanting a species of ions through a surface of a body of semiconductor material to form a buried region of high stress in the body, the buried region defining a thin outer region of semiconductor material;

(b) attaching a stiffening carrier to the thin outer region; and (c) heating the body to promote separation of the thin region from the body;

characterized in that the implantation species is deuterium (D+) and the heating is carried out within the range of about 350 to 450 degrees Centigrade.

2. The method of claim 1 in which heating is carried out within the range of about 350 to 400 degrees Centigrade.

3. The method of claim 1 in which the semiconductor material is silicon.

4. The method of claim 1 in which the stiffening carrier is a high temperature glass.

5. The method of claim 1 in which the implantation species is selectively implanted into the body of semiconductor material in accordance with a predetermined pattern.

6. The method of claim 1 in which a screening layer is formed on the surface of the semiconductor body prior to implantation, and removed from the surface of the semiconductor body subsequent to implantation and prior to attachment of the stiffening carrier.

7. The method of claim 6 in which subsequent to removal of the screening layer from the surface of the semiconductor body, and prior to attachment of the stiffening carrier, the surface is treated to render it hydrophyllic.

8. The method of claim 1 in which the stiffening carrier is silicon, and prior to attachment of the stiffening carrier to the thin outer region, an insulating layer is formed on the surface of the stiffening carrier.

* * * * *